United States Patent
Ishii et al.

(10) Patent No.: US 6,492,680 B1
(45) Date of Patent: Dec. 10, 2002

(54) SEMICONDUCTOR INTEGRATED CIRCUIT DEVICE

(75) Inventors: Kazutoshi Ishii, Chiba (JP); Tetsuo Shioura, Chiba (JP)

(73) Assignee: Seiko Instruments Inc. (JP)

( * ) Notice: Subject to any disclaimer, the term of this patent is extended or adjusted under 35 U.S.C. 154(b) by 147 days.

(21) Appl. No.: 09/632,325

(22) Filed: Aug. 4, 2000

(51) Int. Cl.⁷ .................. H01L 29/76; H01L 29/94; H01L 31/062; H01L 31/113; H01L 31/119

(52) U.S. Cl. .................. 257/344; 257/408; 257/409

(58) Field of Search .................. 257/328, 339, 257/408, 409, 344, 336, 368, 341, 342; 438/179, 286

(56) References Cited

U.S. PATENT DOCUMENTS

| | | | | |
|---|---|---|---|---|
| 5,181,090 A | * | 1/1993 | Maruo | 257/344 |
| 5,436,482 A | * | 7/1995 | Ogoh | 257/344 |
| 5,656,518 A | * | 8/1997 | Gardner et al. | 438/286 |
| 5,965,921 A | * | 10/1999 | Kojima | 257/341 |
| 6,054,743 A | * | 4/2000 | Maekawa | 257/345 |
| 6,146,952 A | * | 11/2000 | Nariman et al. | 257/401 |

* cited by examiner

*Primary Examiner*—Tom Thomas
*Assistant Examiner*—Thien F Tran
(74) *Attorney, Agent, or Firm*—Adams & Wilks

(57) ABSTRACT

There is provided a semiconductor integrated circuit device for driving a display element of an organic EL display device, in which an output current is controlled with high accuracy. The semiconductor integrated circuit device includes a field effect MOS transistor capable of obtaining a high accuracy output current and used for an output circuit for driving the display element of the organic EL display device, and further, a fuse trimming element is provided to its gate electrode, so that the device is constructed by the field effect MOS transistor capable of obtaining a more accurate output current. Besides, the field effect MOS transistor has such a structure that even if Vth fluctuates, fluctuation in an output current value is kept low.

3 Claims, 9 Drawing Sheets

SEMICONDUCTOR INTEGRATED CIRCUIT DEVICE

BACKGROUND OF THE INVENTION

1. Field of the Invention

The present invention relates to a semiconductor integrated circuit device. Besides, the present invention relates to a field effect semiconductor integrated circuit and particularly to a semiconductor integrated circuit device for outputting a high accuracy current, used for EL element driving, LED driving, or the like.

2. Description of the Related Art

FIG. 2 shows an example of a schematic circuit diagram of a MOS transistor constituting an output circuit of a conventional semiconductor integrated circuit device.

In the semiconductor integrated circuit device including a first transistor 10 for switching an output current and a second transistor 20 for varying an output current value, which are electrically connected in series between an external output terminal 40 of the output circuit shown in FIG. 2 and a power source voltage terminal 1, a potential converted to a desired voltage by two dividing resistors 70a provided in series between the power source voltage terminal 1 and a GND terminal 50 is supplied as a gate potential of the second transistor 20.

It is conventionally well known that in this output circuit, the output current value fluctuates due to manufacture fluctuation in the threshold voltage of the second transistor 20, manufacture fluctuation in the resistance value of the dividing resistor 70a, and the like.

Thus, there has been used a method in which the dividing resistor 70a is made a variable resistor and is adjusted later, or a voltage directly controlled from an external connection terminal is applied as the gate potential of the second transistor 20.

Besides, the second transistor 20 has been no function for relieving manufacture fluctuation in the current value.

FIG. 10 shows an example of a conventional MOS semiconductor device. For making the drawing easily viewable, a passivation film and the like are omitted.

In FIG. 10, a gate electrode 209 is formed on an N-type semiconductor substrate 201 through a gate insulating film 206, and a MOS semiconductor element is constituted by $P^+$ source/drain regions 202 and 203, $P^-$ source/drain regions 204 and 205 having an impurity concentration lower than the $P^+$ source/drain regions 202 and 203, and first insulating films 207 and 208 having a thickness larger than the gate insulating film. The $P^+$ source/drain regions 202 and 203 are connected to first metal wirings 213 and 214 through contact holes 211 and 212 and through an interlayer insulating film 210. The $P^-$ source/drain regions 204 and 205 are made short within the range where photolithography technique, high withstand voltage characteristic, or the like permits, so that an increase in an area of the MOS semiconductor element is prevented.

However, in the conventional semiconductor integrated circuit device, there have been problems as follows:

In the case of the insulated gate field effect semiconductor integrated circuit device shown in FIG. 2, since the output current value fluctuates due to the manufacture fluctuation in the threshold voltage of the second transistor 20, the manufacture fluctuation in the resistance value of the dividing resistor 70a, and the like, there has been adopted such a method that the dividing resistor 70a is made the variable resistor, or the gate potential of the second transistor 20 is directly controlled from the external connection terminal, as described above. However, the method includes many factors to increase the cost, such as trouble of varying the resistor, or trouble of inputting a potential with high accuracy from the outside for every IC chip including the circuit shown in FIG. 2.

Moreover, since the second transistor 20 has a large current driving capacity, there has been a defect that when the threshold voltage or the like fluctuates, the output current is also greatly changed.

Besides, in the prior art shown in FIG. 10, variation in drain current is large due to fluctuation in bias applied to the gate electrode, which is not preferable.

SUMMARY OF THE INVENTION

Then, the present invention uses the following means to solve the foregoing problems.

A semiconductor integrated circuit device includes a first MOS transistor for switching an output current and a second MOS transistor for varying an output current value, which are electrically connected in series between an output terminal of an output circuit and a power source voltage terminal, wherein a fuse trimming circuit is provided to a gate electrode of the second MOS transistor.

Besides, the one fuse trimming circuit is provided for every eight circuits each being the output circuit.

Besides, the one fuse trimming circuit is provided for every circuits integer times as many as eight circuits each being the output circuit.

Further, in the second MOS transistor, a gate electrode is provided through a gate oxide film in the vicinity of the surface of a semiconductor substrate, a source side low concentration impurity region and a drain side low concentration impurity region are provided through a thick oxide film at lower sides of both end portions of the gate electrode in a channel direction, the source side low concentration impurity region is provided from the lower side of the gate electrode toward the outside to have a length nearly equal to a channel length, a source region is provided to be connected with an end portion of the source side low concentration impurity region, the drain side low concentration impurity region is provided further toward the outside from the lower side of the gate electrode, and a drain region is provided to be connected with an end portion of the drain side low concentration impurity region.

Besides, the source side low concentration impurity region is provided to have a length of 3 μm to 50 μm.

Besides, the drain side low concentration impurity region is provided to have a length of approximately 1/10 to 1/5 of the length of the source side low concentration impurity region.

In order to solve the foregoing problems, the $P^-$ source region of the MOS semiconductor element is lengthened, so that variation in drain current due to fluctuation in gate bias is made small.

By the foregoing structure, the variation in the drain current to the gate bias becomes small, and constant current output characteristics of the MOS semiconductor element can be stabilized.

DETAILED DESCRIPTION OF THE PREFERRED EMBODIMENTS

Embodiments of present invention will be described below with reference to the drawings.

Figure 1:
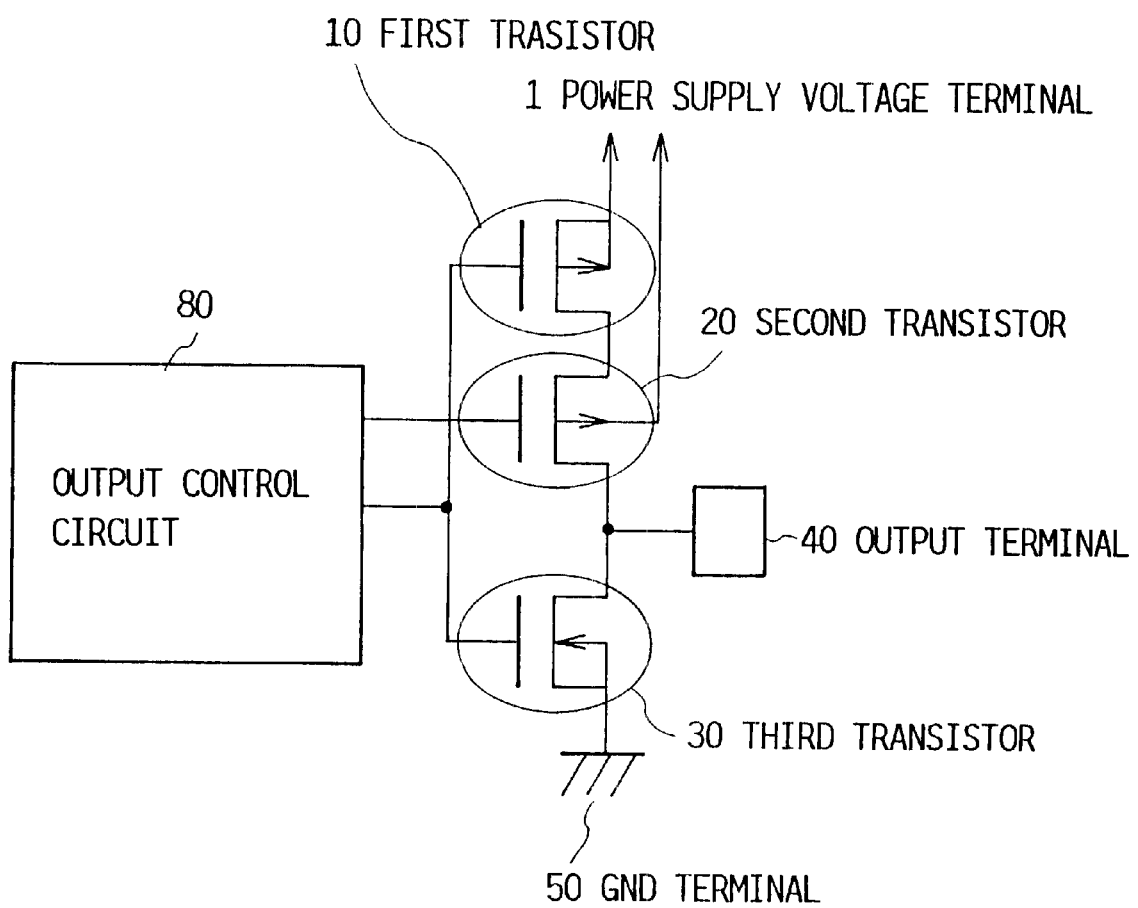
FIG. 1 is a schematic circuit diagram of a semiconductor integrated circuit device of the present invention.
Figure 2:
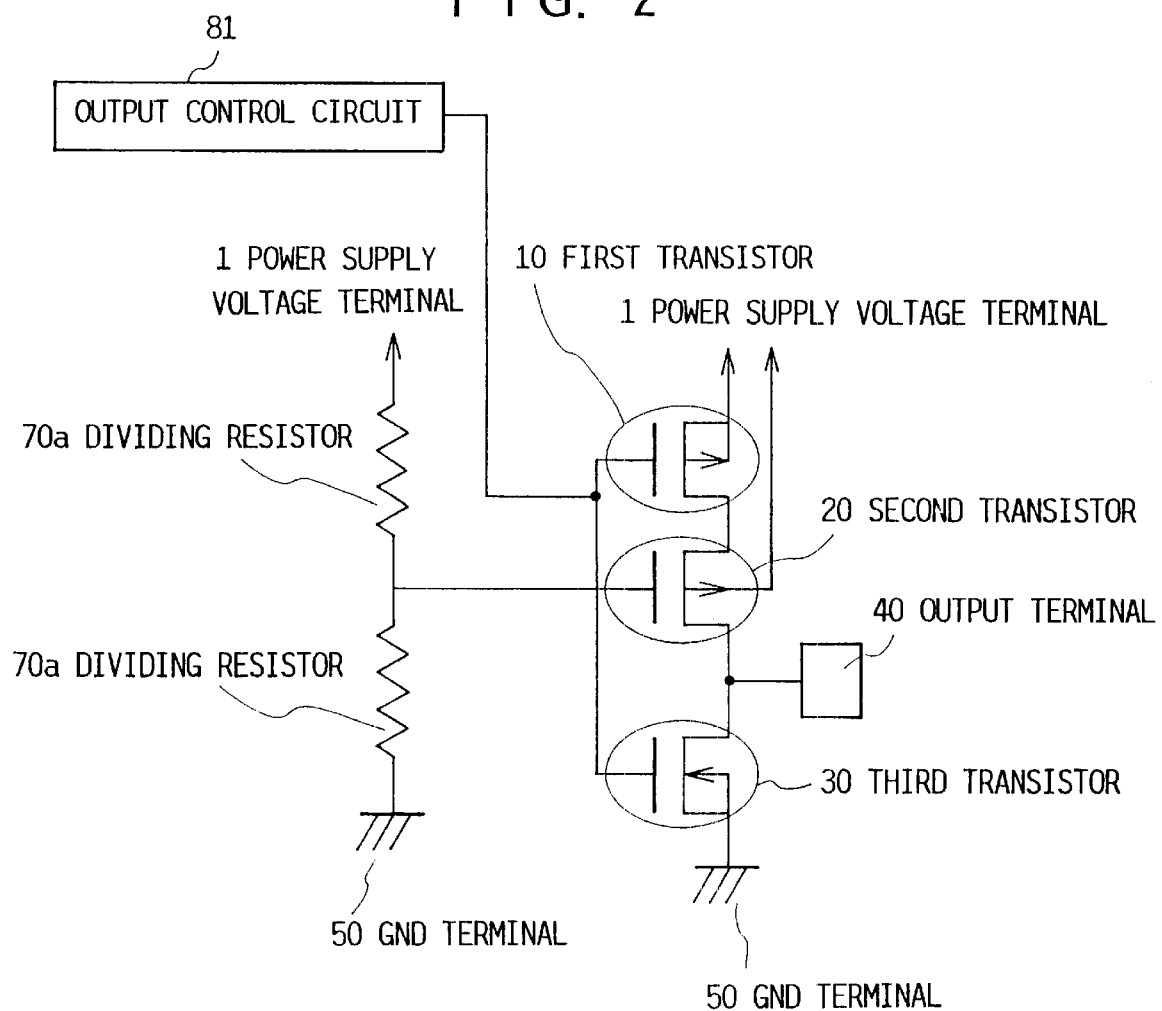
FIG. 2 is a schematic circuit diagram of a conventional semiconductor integrated circuit device.

A semiconductor integrated circuit device of the present invention shown in FIG. 1 includes a field effect MOS transistor which can obtain a high accuracy output current used for, for example, an output circuit for driving a display element of an organic EL (organic electroluminescence) display device, and further, a fuse trimming element is provided to a gate electrode, so that the field effect MOS transistor capable of obtaining an output current with higher accuracy is constructed.

Hereinafter, a semiconductor integrated circuit device of the present invention will be described in detail with reference to the drawings.

FIG. 1 is a schematic circuit diagram of an output circuit of a semiconductor integrated circuit device according to a first embodiment of the present invention. The output circuit includes an external output terminal 40, a P-type first transistor 10 provided between the external output terminal 40 and a power source voltage terminal 1 and for switching an output current, a P-type second transistor 20 electrically connected in series with the first transistor 10 and for varying an output current value, and an N-type third transistor 30 connected between the external output terminal 40 and a GND terminal 50 and for switching an output current. A gate electrode of the first transistor 10 for switching the output current and that of the third transistor 30 are connected to an output control circuit 80, and a gate electrode of the second transistor 20 for varying the output current value is connected to the output control circuit 80 through another wiring line. The output current of the second transistor 20 is set to a specified current value with high accuracy within the range of about 1 $\mu$A to 100 $\mu$A, and it is structured to have constant current characteristics from the GND potential to the power source voltage level. Thus, when the first transistor is in an ON state, since only a voltage close to the power source voltage is applied to a drain electrode of the first transistor 10, it is also possible to set drain withstand voltage of the first transistor 10 at the ON time to a level not higher than the power source voltage level.

In order to secure the constant current characteristics, a voltage Vg which is not lower than threshold voltage Vth where a channel is always formed and which can keep a saturation operating state, is applied to the gate electrode of the second transistor 20. On this account, it is necessary that Vth of the second transistor 20 is set as low as possible in enhancement or set as deep as possible in depletion. Particularly, at the time of an operation state where a voltage of the external output terminal 40 is close to the power source voltage, a possibility that it becomes impossible to keep the saturation state, becomes high. On this account, a mutual relation between an external load connected to the external output terminal 40 and driving capacity of the third transistor 30, and an operation potential difference range Vout between the first external output terminal 40 and the power source voltage, which is determined by an operation speed, are set so that the following two relational expressions can be maintained.

|Vg-Vth|<|Vout|, Vg-Vth>0

Since the device structure of the second transistor 20 is such that a potential difference between a gate potential and a substrate potential is 1/10 or less as compared with the power source voltage, the thickness of a gate oxide film can be made greatly thin as compared with the first transistor 10. Although there is no problem in electric field strength if it is not higher than 4 MV/cm, it is preferable to select a film thickness in which manufacture fluctuation in Vth becomes smallest. Especially in the case of an application requiring a high driving capacity, it is preferable to make the thickness 150 angstroms or less, or 100 angstroms or less. However, it is necessary to relieve the electric field strength applied to the gate oxide film by using an offset drain structure shown in FIG. 4, an offset LDD structure shown in FIG. 5, a drain structure using a LOCOS bird's beak shown in FIG. 6, or the like.

Figure 4:
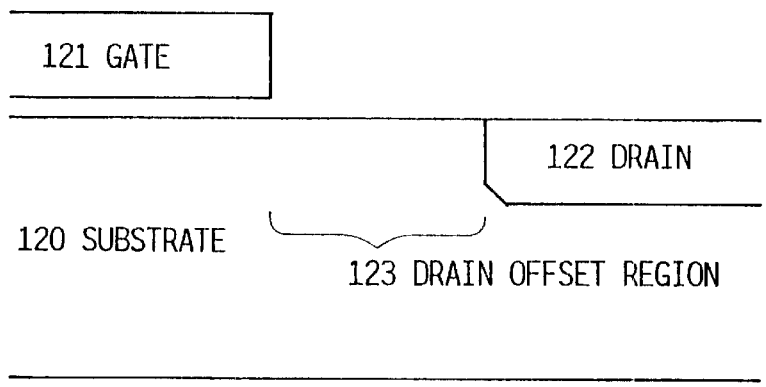
FIG. 4 is a structural view showing an offset drain structure.

FIG. 4 shows a relaxation example of electric field strength, which applied to gate oxide film, by drain 122, which formed adjoining on a surface of semiconductor substrate 120 and separated from drain 122. Drain offset region 123 is formed between gate 121 and drain 122, and depletion layer formed in the region by drain electric field decreases potential difference between drain 122 and gate 121 then the electric field strength applied to gate field oxide can be relaxed.

Figure 5:
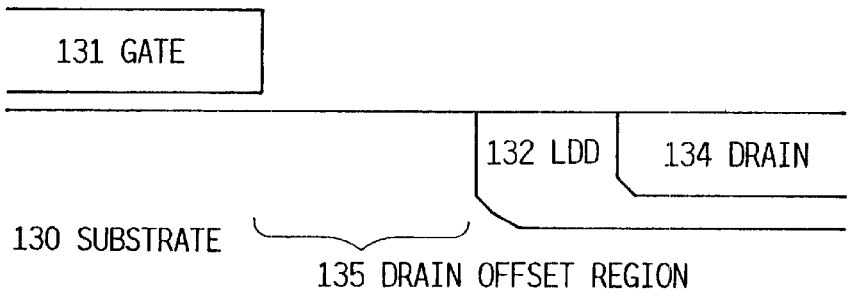
FIG. 5 is a structural view showing an offset LDD structure.

FIG. 5 shows a relaxation example of electric field strength, which applied to gate oxide film by LDD region 132 and drain 134 adjoining on a surface of semiconductor substrate 130 and separated from gate 131. Drain offset region 135 is formed between gate 131 and Lightly Doped Drain LDD 132 and depletion layer in the region formed by drain electric field decreases potential difference between drain 134 and gate 131. Then the electric field strength applied to gate field oxide can be relaxed. Further depletion layer is formed in LDD 132 region so the electric field strength applied to gate field oxide can be relaxed.

Figure 6:
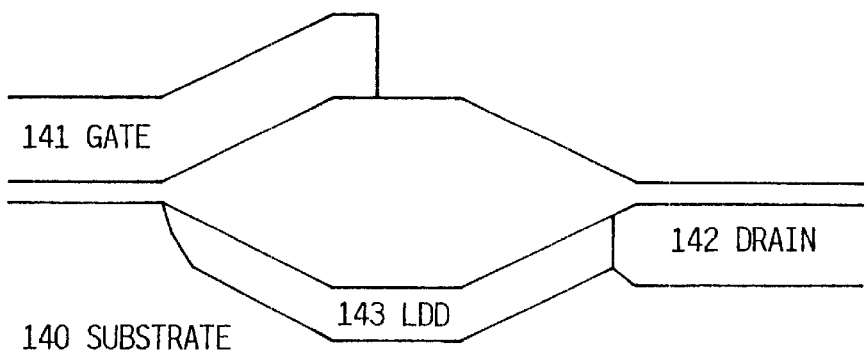
FIG. 6 is a drain structural view using a LOCOS bird's beak.

FIG. 6 shows a relaxation example of electric field strength, which applied to gate oxide film. Because gate 141 is formed above substrate 140 and thick oxide is on LDD 133 region. Thick oxide is formed between an end of gate 141 and LDD 143 then the electric field strength is low. Further depletion layer is formed in LDD 143 by electric field between drain 142 and gate 141 and decrease a potential difference between drain 142 and gate 141. Then the electric field strength, which applied on gate oxide is relaxed.

Figure 3:
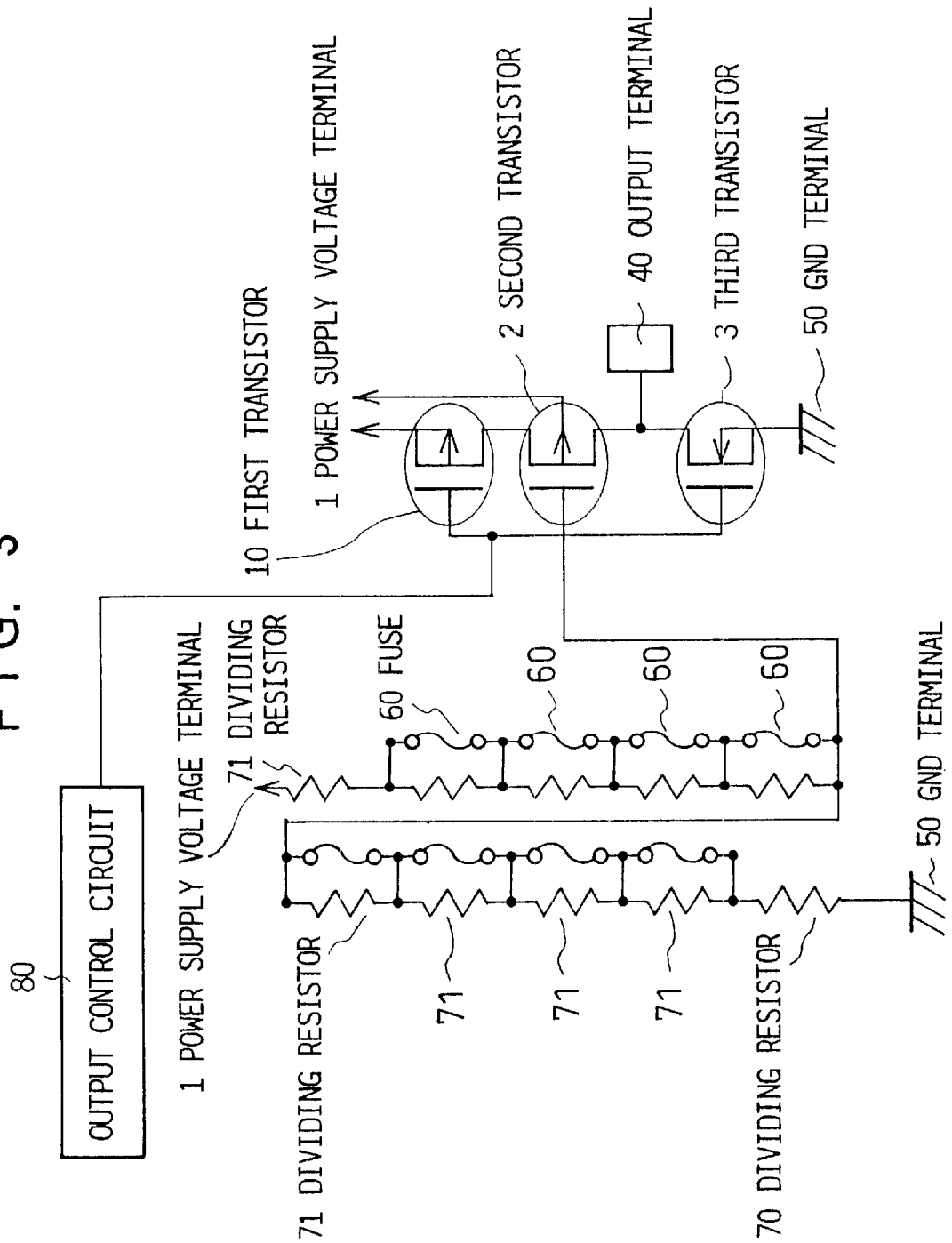
FIG. 3 is a schematic circuit diagram of a semiconductor integrated circuit device of the present invention.

FIG. 3 is a schematic circuit diagram of an output circuit of a semiconductor integrated circuit device according to a second embodiment of the present invention.

In the output circuit, a P-type first transistor 10 for switching an output current and a P-type second transistor 2 for varying an output current value are connected in series between an external output terminal 40 and a power source voltage terminal 1. An N-type third transistor 3 for switching an output current is connected between the external output terminal 40 and a GND terminal 50. A gate electrode of the first transistor 10 for switching the output current and that of the third transistor 30 are connected to an output control circuit 80. A gate electrode of the second transistor 2 for varying the output current value is connected to a fuse trimming circuit.

The fuse trimming circuit is a circuit in which a plurality of trimming elements, in each of which a plurality of fuses 60 and a plurality of dividing resistors 71b are connected in parallel with each other, are connected between the power source voltage terminal 1 and a dividing resistor 70 connected to the GND terminal 50. The gate electrode of the second transistor 2 is connected to the trimming element of a desired potential level in the fuse trimming circuit. This is for setting an output current of the second transistor 2 to a specified current value with high accuracy within the range of about 1 $\mu$A to 100 $\mu$A, and the second transistor 2 is constructed so as to have constant current characteristics from the GND potential to the power source voltage level. That is, this makes it possible to suppress the variation in the output current value due to the manufacture fluctuation in the threshold voltage Vth of the second transistor 20 by trimming.

In the case of a MOS transistor, typical parameters for varying an output current value are a channel length, channel width, threshold voltage, and the like. In the case of an analog circuit as in the present invention, although design for decreasing the manufacture fluctuation is easy with respect to the channel length and the channel width, it is not easy to decrease the manufacture fluctuation by design technique with respect to the threshold voltage Vth. Then, it is necessary that a correlation between manufacture fluctuation and product specification is derived in advance to provide a desired number of trimming elements.

In the case where a plurality of output circuits are included, although it is desirable that the trimming circuit is provided for all output circuits, as needed, there is a case where one fuse trimming circuit is provided for every eight output circuits, or for every output circuits integer times as many as eight output circuits.

Although not shown, in the case where a plurality of semiconductor devices of the present invention are used for a position display panel, if a large difference is generated in output current values of adjacent output circuits between adjacent semiconductor devices, there is a possibility that a problem occurs in display quality of the display panel. Thus, it is also possible to form such a structure that an output circuit at each of both ends of the semiconductor device includes a current monitoring circuit and a feedback circuit.

In this case, an output current value of an end portion of a semiconductor device is compared with an output current value of an end portion of an adjacent semiconductor device, and such a structure is formed that current values for making the display quality most excellent are outputted from the respective output circuits. In this case, it is preferable that the output circuit provided inside of the end output circuit by about eight circuits also has the same adjusting function of the output current value.

Figure 7:
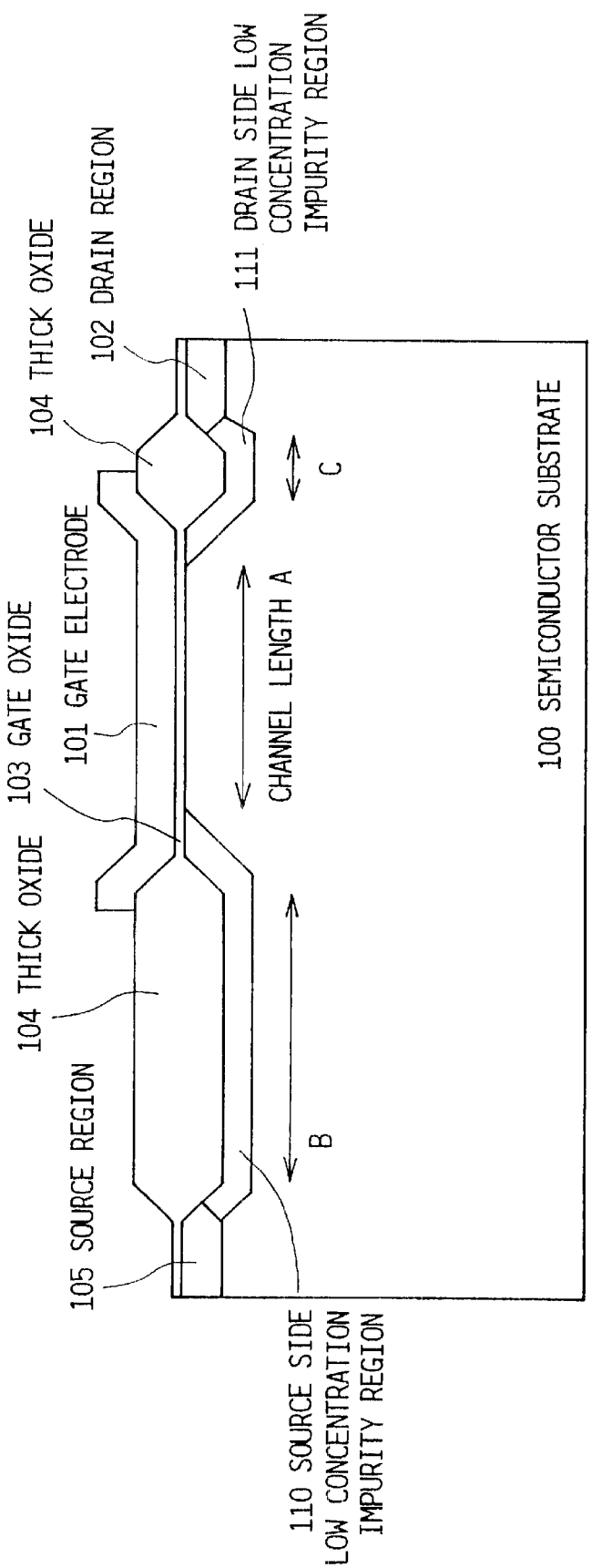
FIG. 7 is a schematic sectional view of a field effect MOS transistor for high accuracy current output in an output circuit of a semiconductor integrated circuit device of the present invention.

FIG. 7 is a schematic sectional view of a field effect MOS transistor for high accuracy current output in an output circuit of a semiconductor integrated circuit device according to a third embodiment of the present invention.

In the foregoing first and second embodiments, in order to control the output current value of the second MOS transistor 20 with high accuracy, the method of making the gate voltage value variable is used. This third embodiment has such a structure that even if Vth of the second MOS transistor 20 fluctuates, fluctuation in the output current value is kept low.

In the field effect MOS transistor for the high accuracy current output according to the present invention, a gate electrode 101 is provided near the surface of a semiconductor substrate 100 through a gate oxide film 103, a source side low concentration impurity region 110 and a drain side low concentration impurity region 111 are provided at lower sides of both end portions of the gate electrode 101 in a channel direction through a thick oxide film 104, the source side low concentration impurity region 110 is provided from the lower side of the gate electrode 101 toward the outside to have a length B nearly equal to a channel length A, a source region 105 is provided to be connected to an end portion of the source side low concentration impurity region 110, the drain side low concentration impurity region 111 is provided from the lower side of the gate electrode 101 toward the outside to have a length C of approximately 1/10 to 1/5 of the length of the source side low concentration impurity region 110, and a drain region 102 is provided to be connected to an end portion of the drain side low concentration impurity region 111.

Here, as the thick oxide film 104, it is preferable to use a field oxide film to simplify a manufacturing process and to form a bird's beak structure at the end portion of the thick oxide film 104.

The channel length A is determined by the relation between a ratio of a fluctuation range of working length to a channel length, and a ratio of a required current fluctuation range to an output current value. Of course, it is necessary to set the former ratio smaller than the latter ratio.

Although there is a method in which the length B of the source side low concentration impurity region 110 is made nearly equal to the channel length A, it is desirable to determine the length in such a method that an output current value conforms to a required value at a convergence point of interaction between an increase of Vth due to a back gate effect determined by a product of an output current value by a resistance value of the source side low concentration impurity region 110, and suppression of the back gate effect due to lowering of the output current value by the increase of Vth.

It is common to construct the source side low concentration impurity region 110 with a length of about 3 $\mu$m to 50 $\mu$m, though it depends on conditions such as a minimum working width in a manufacturing factory or required specification. In the case where an output circuit size becomes large and the number of outputs is large, since there occurs a harmful effect of enlargement of a chip size, it is realistic to construct the region with the length of about 5 $\mu$m to 20 $\mu$m.

Since the drain side low concentration impurity region 111 is determined by alignment accuracy between the gate electrode 101 and the thick oxide film 104, a minimum working width of the thick oxide film 104, an operation voltage range of the drain region 102, and the like, it is realistic to construct the region with a length of about 1 μm to 3 μm, though it depends on conditions such as a minimum working width in a manufacturing factory or required specification. It is not always necessary to make the length about 1/10 to 1/5 of the length of the source side low concentration impurity region 110.

In the case where the field effect MOS transistor for the high accuracy current output according to the present invention is used for the output circuit of FIG. 1, since the second MOS transistor 20 requires constant current operation in a wide range from the GND potential to the power source voltage, a potential applied to the gate electrode is set to make a saturation operating state in the entire voltage range. On this account, the gate potential Vg becomes close to Vth and Vg>Vth. This makes the fluctuation in the output current value due to the variation in Vth more remarkable.

Figure 8:
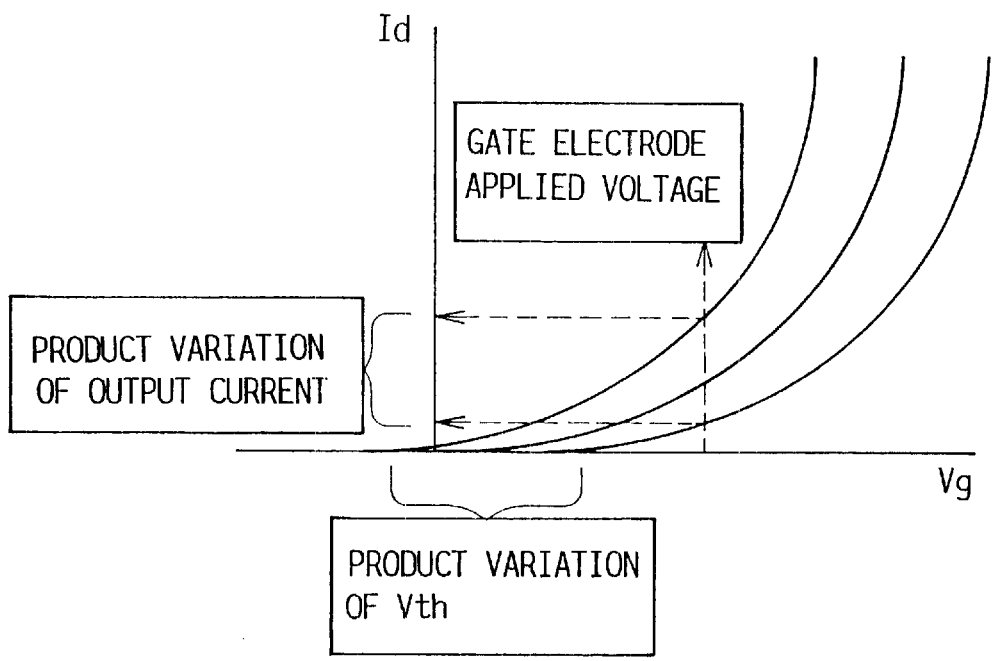
FIG. 8 is a schematic characteristic view of Vg-Id of a conventional MOS transistor at the time of saturation.

FIG. 8 shows an influence of fluctuation in an output current value due to fluctuation in Vth at the time of saturation of Vg-Id of a generally well-known field effect MOS transistor.

Figure 9:
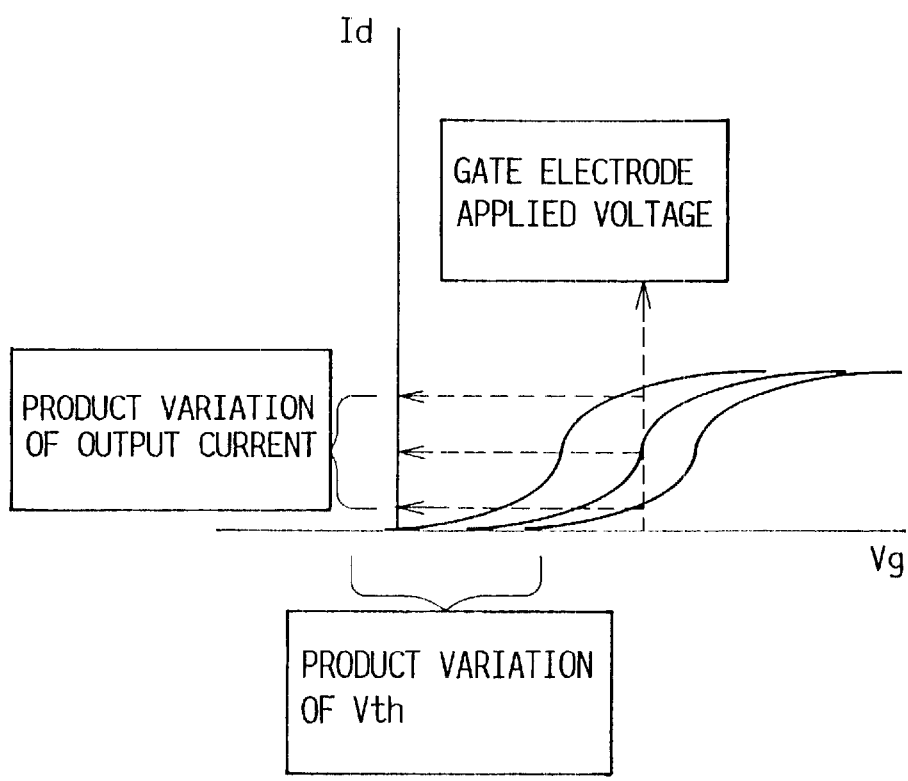
FIG. 9 is a schematic characteristic view of Vg-Id of a MOS transistor of the present invention at the time of saturation.
Figure 10:
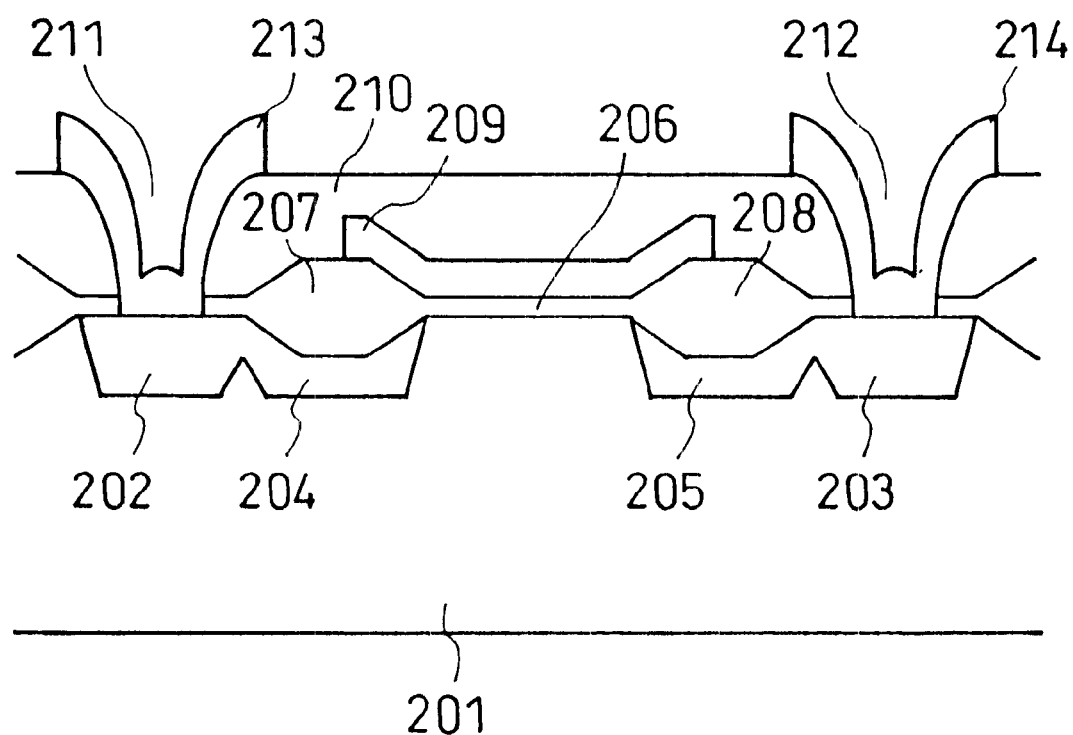
FIG. 10 is a sectional structural view of a conventional semiconductor device.

On the other hand, in the field effect MOS transistor for the high accuracy current output according to the present invention shown in FIG. 7, since the driving capacity per unit is lowered, the channel width is set large so that the same output current value is obtained. In this case, as shown in FIG. 9, even if Vth is changed in the same way, it is possible to reduce the width of fluctuation in the output current value.

Besides, the source side low concentration impurity region 110 of FIG. 7 causes a voltage effect by the flow of current. This voltage effect causes the back bias effect to the second MOS transistor 20 by providing the high resistance low concentration impurity region between the source electrode and the channel end, and Vth increases in the case where Vth is low and a larger current flows, so that an effect to decrease an output current occurs, and it is possible to reduce the fluctuation range at the side where the output current is large. On the contrary, in the case where Vth is high and a smaller current flows, an increase of Vth becomes small, so that there occurs an effect to increase the output current, and it is possible to reduce the fluctuation range at the side where the output current is small.

Figure 11:
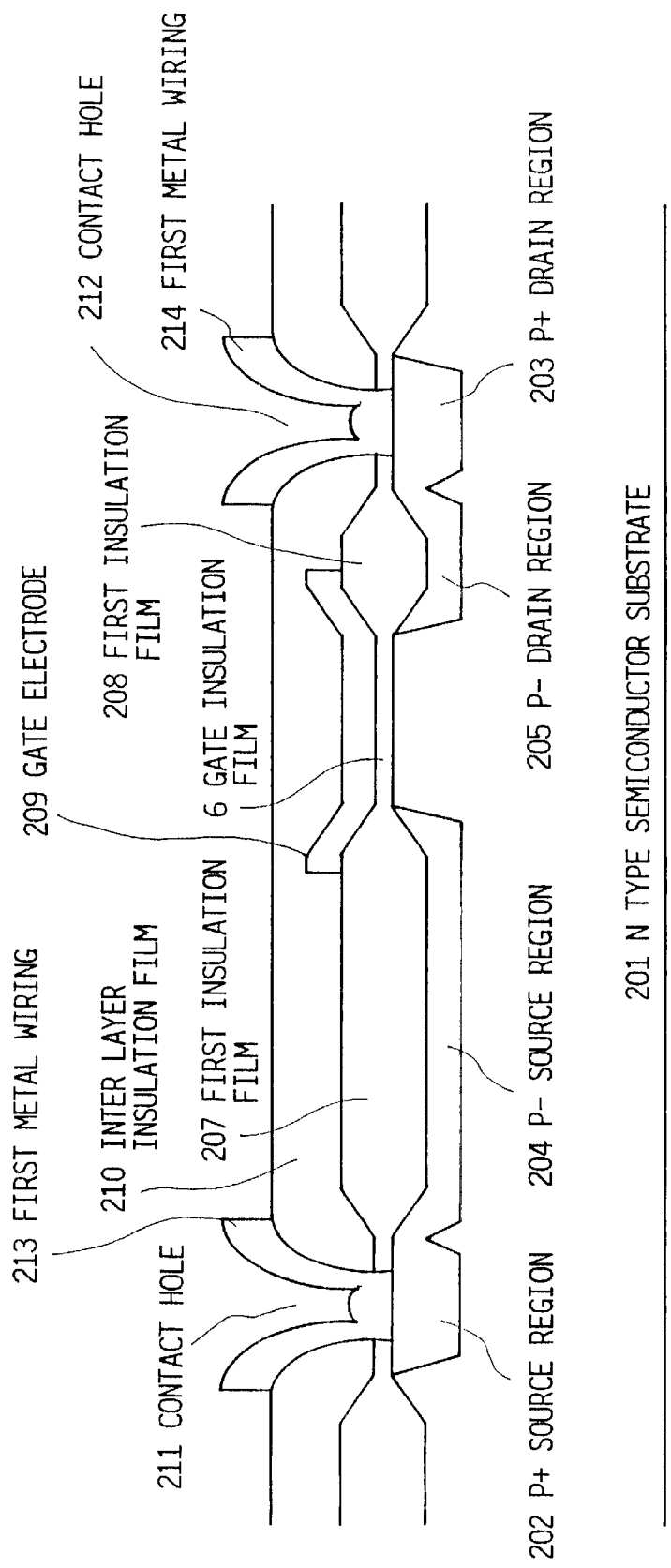
FIG. 11 is a sectional structural view of a semiconductor device of a fourth embodiment of the present invention.

FIG. 11 is a sectional structural view showing a fourth embodiment of the present invention. In FIG. 11, this embodiment has a structure including a gate electrode 209 made of polycrystal silicon or the like and formed on an N-type semiconductor substrate 201 through a gate insulating film 206, first insulating films 207 and 208 which are formed on a P⁻ drain region 205 of a surface of the N-type semiconductor substrate 201 and a P⁻ source region 204 longer than the P⁻ drain region 205 and are thicker than the gate insulating film 206, P⁺ source/drain regions 202 and 203, and first metal wirings 213 and 214 made of aluminum or the like and connected to the P⁺ source/drain regions 202 and 203 through an interlayer insulating film 210 and through contact holes 211 and 212. Of course, the gate electrode 209 and the N-type semiconductor substrate 201 are connected. Here, it is preferable that the length of the P⁻ source region is 10 μm or more, if possible.

According to this structure, since mutual conductance (gm) of a PMOS transistor is lowered, variation in drain current due to fluctuation in gate bias becomes small, and it is possible to stabilize constant current output characteristics of a MOS semiconductor element.

Figure 12:
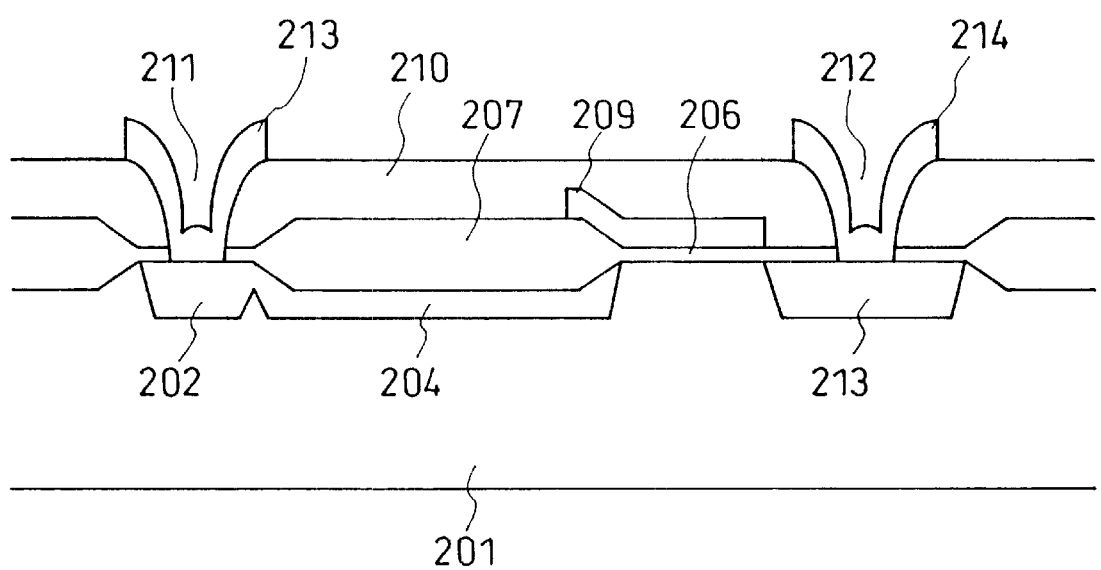
FIG. 12 is a sectional structural view of a semiconductor device of a fifth embodiment of the present invention.

FIG. 12 shows a fifth embodiment of the present invention. Similarly to the fourth embodiment, this embodiment has a structure including a gate electrode 209 made of polycrystal silicon or the like and formed on an N-type semiconductor substrate 201 through a gate insulating film 206, a first insulating film 207 which is formed on a P⁻ source region 204 of a surface of the N-type semiconductor substrate 201 and is thicker than the gate insulating film 206, P⁺ source/drain regions 202 and 213, and first metal wirings 213 and 214 made of aluminum or the like and connected to the P⁺ source/drain regions 202 and 213 through contact holes 211 and 212.

Also in this embodiment, similarly to the fourth embodiment, there is an effect to stabilize the constant current output characteristics of a MOS semiconductor element.

Incidentally, in the foregoing fourth embodiment or fifth embodiment, although the case of the PMOS transistor is exemplified, also in the NMOS transistor, if the structure of the present invention is adopted, similar effects are obtained.

As described above, according to the present invention, in the semiconductor integrated circuit device, since the variation in the output current value due to the manufacture fluctuation can be relieved, it is possible to easily construct a function capable of outputting a current value with high accuracy. On this account, there is an effect to reduce manufacturing costs caused by an increase of steps at the time of mounting.

Besides, according to the present invention, by elongating the P⁻ source region of the MOS semiconductor element, there are effects that constant current output characteristics of the MOS semiconductor element are stabilized and that stable operation of the semiconductor integrated circuit is realized.

What is claimed is:

1. A semiconductor integrated circuit device comprising: a gate electrode provided near a surface of a semiconductor substrate through a gate oxide film, a source side low concentration impurity region and a drain side low concentration impurity region provided through a thick oxide film at lower sides of opposite end portions of the gate electrode in a channel direction, the source side low concentration impurity region extending from the lower side of the gate electrode toward the outside and having a length nearly equal to a channel length, a source region connected with an end portion of the source side low concentration impurity region, the drain side low concentration impurity region extending from the lower side of the gate electrode toward the outside and having a length less than that of the source side low concentration impurity region, and a drain region connected with an end portion of the drain side low concentration impurity region.

2. A semiconductor integrated circuit device according to claim 1, wherein the source side low concentration impurity region has a length of 3 μm to 50 μm.

3. A semiconductor integrated circuit device according to claim 1, wherein the drain side low concentration impurity region has a length of approximately 1/10 to 1/5 of the length of the source side low concentration impurity region.

* * * * *